US011108366B2

(12) United States Patent
Chen et al.

(10) Patent No.: US 11,108,366 B2
(45) Date of Patent: Aug. 31, 2021

(54) AMPLIFIER CIRCUIT

(71) Applicant: RichWave Technology Corp., Taipei (TW)

(72) Inventors: Chih-Sheng Chen, Taipei (TW); Ching-Wen Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 140 days.

(21) Appl. No.: 16/509,450

(22) Filed: Jul. 11, 2019

(65) Prior Publication Data

US 2020/0112293 A1    Apr. 9, 2020

(30) Foreign Application Priority Data

Oct. 3, 2018    (TW) ................. 107134884

(51) Int. Cl.
| | |
|---|---|
| H03F 3/72 | (2006.01) |
| H03F 1/22 | (2006.01) |
| H03F 3/45 | (2006.01) |
| H03F 3/185 | (2006.01) |

(52) U.S. Cl.
CPC ......... *H03F 3/45179* (2013.01); *H03F 1/223* (2013.01); *H03F 3/185* (2013.01); *H03F 2200/372* (2013.01)

(58) Field of Classification Search
CPC ..... H03F 1/22; H03F 3/68; H03F 3/72; H03F 1/223
USPC .......................................... 330/51, 126, 311
See application file for complete search history.

(56) References Cited

U.S. PATENT DOCUMENTS

| | | |
|---|---|---|
| 6,181,206 B1 | 1/2001 | Palmisano |
| 6,657,498 B2 | 12/2003 | Park |
| 6,756,848 B2 | 6/2004 | Garcia |
| 7,023,272 B2 | 4/2006 | Hung |
| 7,352,247 B2 | 4/2008 | Oh |
| 8,102,213 B2 | 1/2012 | Tasic |
| 8,175,566 B2 | 5/2012 | Tasic |
| 8,698,560 B2 | 4/2014 | Li |
| 8,729,966 B2 | 5/2014 | Takagi |
| 9,059,665 B2 | 6/2015 | Youssef |
| 9,184,707 B2 | 11/2015 | Rangarajan |

(Continued)

FOREIGN PATENT DOCUMENTS

| | | |
|---|---|---|
| CN | 103107791 B | 3/2015 |
| TW | I499200 B | 9/2015 |
| WO | 2008102788 A1 | 8/2008 |

*Primary Examiner* — Steven J Mottola
(74) *Attorney, Agent, or Firm* — Winston Hsu

(57) ABSTRACT

An amplifier circuit includes an output terminal, an amplification unit and a switch. The output terminal is used to output an amplification signal. The amplification unit includes a first transistor and a second transistor. The first transistor includes a control terminal for receiving a first input signal, a first terminal coupled to the output terminal for outputting an amplified first input signal, and a second terminal. The second transistor includes a control terminal for receiving a second input signal, a first terminal coupled to the output terminal for outputting an amplified second input signal, and a second terminal. The switch includes a first terminal coupled to the second terminal of the first transistor, and a second terminal. The amplification signal is generated using at least the amplified first input signal and/or the amplified second input signal.

14 Claims, 10 Drawing Sheets

(56) References Cited

U.S. PATENT DOCUMENTS

| | | |
|---|---|---|
| 10,050,653 B2 | 8/2018 | Pehlivanoglu |
| 2005/0231290 A1 | 10/2005 | Hung |
| 2006/0022748 A1 | 2/2006 | Udagawa |
| 2009/0085668 A1 | 4/2009 | Gao |
| 2013/0315348 A1 | 11/2013 | Tasic |
| 2016/0204966 A1 | 7/2016 | Kim |
| 2019/0372528 A1* | 12/2019 | Pal .......................... H03F 1/223 |

* cited by examiner

AMPLIFIER CIRCUIT

CROSS REFERENCE TO RELATED APPLICATION

This application claims priority to Taiwan Patent Application No. 107134884, filed Oct. 3, 2018, and incorporated herein by reference in its entirety.

TECHNICAL FIELD

The disclosure is related to an amplifier circuit, and more particularly, an amplifier circuit supporting various operation modes.

BACKGROUND

In the field of circuit application, amplifier circuits are often used. In an amplifier circuit, an input terminal can be used to receive an input signal, the input signal can be amplified to generate an amplified signal, and an output terminal can output the amplified signal. However, a conventional amplifier circuit can merely be used to perform signal process for a single input signal rather than supporting various operation modes.

SUMMARY

An embodiment provides an amplifier circuit comprising an output terminal, an amplification unit and a switch. The output terminal is configured to output an amplification signal. The amplification unit comprises a first transistor and a second transistor. The first transistor comprises a control terminal configured to receive a first input signal, a first terminal coupled to the output terminal and configured to output an amplified first input signal, and a second terminal. The second transistor comprises a control terminal configured to receive a second input signal, a first terminal coupled to the output terminal and configured to output an amplified second input signal, and a second terminal. The switch comprises a first terminal coupled to the second terminal of the first transistor, and a second terminal. The amplification signal is generated using at least the amplified first input signal and/or the amplified second input signal.

Another embodiment provides an amplifier circuit comprising an output terminal, an amplification unit and a switch. The output terminal is configured to output an amplification signal. The amplification unit comprises a first transistor, a second transistor and a third transistor. The first transistor comprises a control terminal configured to receive a first input signal, a first terminal coupled to the output terminal and configured to output an amplified first input signal, and a second terminal. The second transistor comprises a control terminal configured to receive a second input signal, a first terminal coupled to the output terminal and configured to output an amplified second input signal, and a second terminal. The third transistor is coupled between the output terminal and the first transistor, and is coupled between the output terminal and the second transistor. The third transistor comprises a first terminal coupled to the output terminal, and a second terminal. The switch comprises a first terminal coupled to the second terminal of the third transistor, and a second terminal coupled to the first terminal of the first transistor. The amplification signal is generated using at least the amplified first input signal and/or the amplified second input signal.

DETAILED DESCRIPTION

Figure 1:
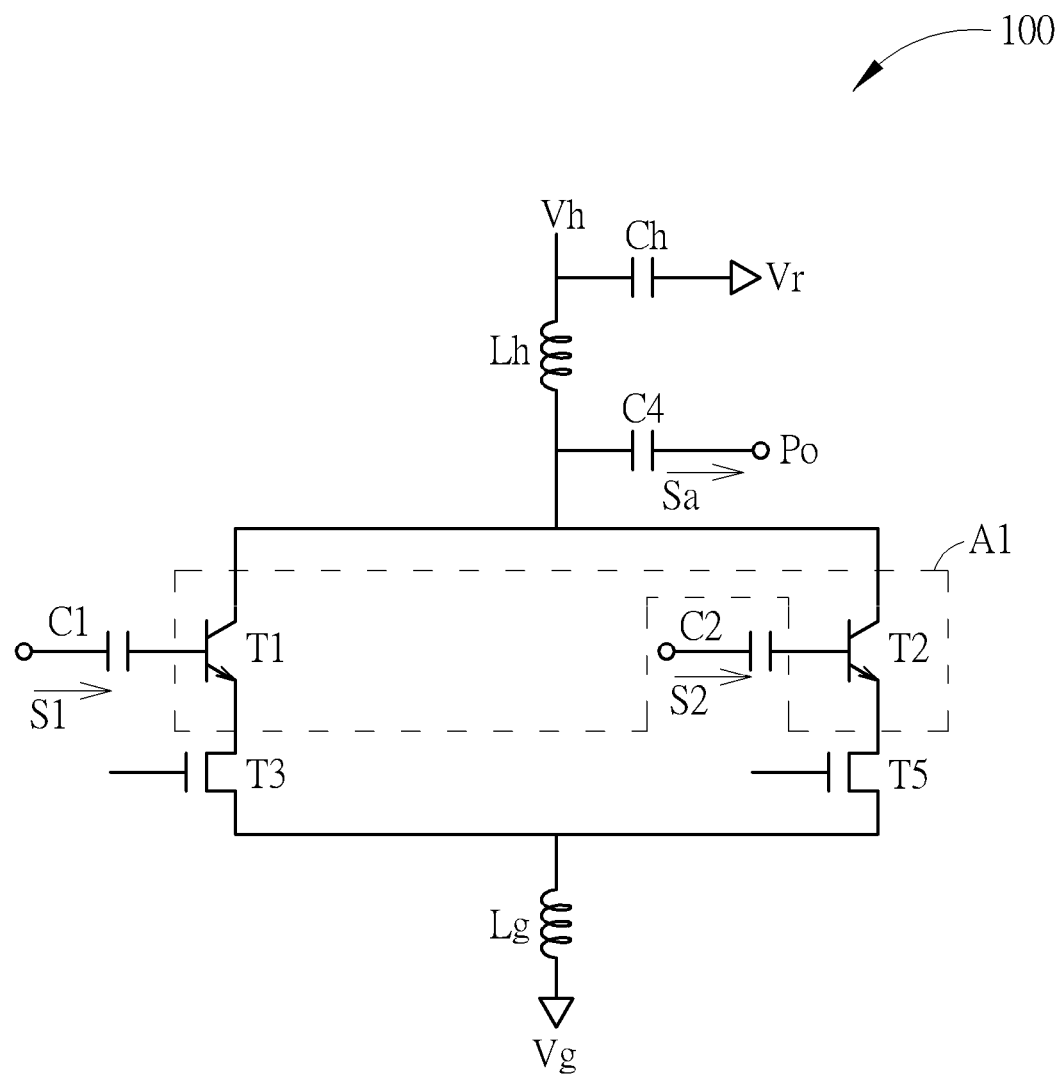
FIG. 1 illustrates an amplifier circuit according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates an amplifier circuit 100 according to an embodiment. The amplifier circuit 100 may include an amplification unit A1. The amplification unit A1 may include transistors T1 and T2. The transistor T1 may include a control terminal, a first terminal and a second terminal, where the control terminal is used as a first input terminal of the amplifier circuit 100 for receiving an input signal S1, the first terminal may be coupled to an output terminal Po for outputting an amplified input signal S1. The transistor T2 may include a control terminal, a first terminal and a second terminal, where the control terminal is used as a second input terminal of the amplifier circuit 100 for receiving an input signal S2, and the first terminal may be coupled to the output terminal Po for outputting an amplified input signal S2. The output terminal Po may be used to output an amplification signal Sa, and the amplification signal Sa may be generated using at least the amplified input signal S1 and/or the amplified input signal S2.

As shown in FIG. 1, the amplifier circuit 100 may optionally further include switches T3 and T5. The switch T3 may include a first terminal and a second terminal, where the first terminal is coupled to the second terminal of the transistor T1. The switch T5 may include a first terminal and a second terminal, where the first terminal may be coupled to the second terminal of the transistor T2. The amplifier circuit 100 may optionally further include capacitors C1, C2 and C4. The capacitor C1 may be coupled to the control terminal of the transistor T1. The capacitor C2 may be coupled to the control terminal of the transistor T2. The capacitor C4 may be coupled between the output terminal Po and the first terminal of the transistor T1 and be coupled between the output terminal Po and the first terminal of the transistor T2. The capacitors C1, C2 and C4 may be DC (direct-current) blocking capacitors. When a component is described to be optionally included in a circuit, it is allowed to determine whether the component is included in the circuit as needed, and it is within the scope of embodiments no matter the component is included or is not included in the circuit. Furthermore, when it is described herein to optionally include a plurality of components, for example, when it is described to optionally include components A, B and C, it is meant to optionally include at least one of the components A, B and C; optionally include a plurality of ones (such as two or more) of the components A, B and C; or include none of the components A, B, and C. All abovementioned conditions are within the scope of embodiments.

According to an embodiment, the amplifier circuit 100 may further include inductors Lh and Lg and a capacitor Ch. The inductor Lh may include a first terminal and a second terminal, where the first terminal may be coupled to a voltage terminal Vh, and the second terminal may be coupled to the first terminal of the transistor T1 and the first terminal of the transistor T2. The inductor Lg may include a first terminal and a second terminal, where the first terminal may be coupled to the second terminal of the switch T3 and the second terminal of the switch T5, and the second terminal may be coupled to a voltage terminal Vg. The inductors Lh and Lg may be used to provide impedance matching. The capacitor Ch may be coupled between the voltage terminal Vh and a reference voltage terminal Vr. The reference voltage terminal Vr may be used to receive a reference voltage. The capacitor Ch may be an AC (alternating current) short capacitor for allowing AC signals to pass through. The voltage terminals Vh and Vg may be different reference voltage terminals. For example, the voltage terminal Vh may be a supply voltage terminal, and the voltage terminal Vg may be a ground terminal. The reference voltage terminal Vr may be (but not limited to) the voltage terminal Vg.

According to the embodiment of FIG. 1, when the amplifier circuit 100 is used to amplify the input signal S1, the amplification signal Sa is generated using the amplified input signal S1, the transistor T1 and the switch T3 may be turned on, and the transistor T2 and the switch T5 may be turned off. Because the second terminal of the transistor T1 and the second terminal of the transistor T2 may form a common structure, the turned-off switch T5 may make it difficult for the input signal S1 to leak to the transistor T2 through the turned-on switch T3, and unwanted conduction caused by the input signal S1 changing a voltage between the control terminal and the second terminal of the transistor T2 may be reduced. Hence, it may be reduced that the control terminal of the transistor T1 and the control terminal of the transistor T2 interfere with one another. In other words, the isolation between the first input terminal and the second input terminal of the amplifier circuit 100 may be improved. Furthermore, because there may exist a parasitic capacitor between the first terminal and the second terminal of the turned-off transistor T2, the turned-off switch T5 may make it difficult for the input signal S1 to leak to the output terminal Po through the parasitic capacitor of the turned-off transistor T2. Hence, the interference with the output terminal Po may be reduced where the interference is caused by the input signal S1 leaking through the parasitic capacitor of the turned-off transistor T2. In other words, the influence caused by unused paths of the amplifier circuit 100 upon the output terminal Po may be reduced. Likewise, when the amplifier circuit 100 is used to amplify the input signal S2, the amplification signal Sa is generated using the amplified input signal S2, the transistor T1 and the switch T3 may be turned off, and the transistor T2 and the switch T5 may be turned on. Because the second terminal of the transistor T1 and the second terminal of the transistor T2 may form a common structure, the turned-off switch T3 may make it difficult for the input signal S2 to leak to the transistor T1 through the turned-on switch T5, and unwanted conduction caused by the input signal S2 changing a voltage between the control terminal and the second terminal of the transistor T1 may be reduced. Hence, it may be reduced that the control terminal of the transistor T2 and the control terminal of the transistor T1 interfere with one another. In other words, the isolation between the first input terminal and the second input terminal of the amplifier circuit 100 may be improved. Furthermore, because there may exist a parasitic capacitor between the first terminal and the second terminal of the turned-off transistor T1, the turned-off switch T3 may make it difficult for the input signal S2 to leak to the output terminal Po through the parasitic capacitor of the turned-off transistor T1. Hence, the interference with the output terminal Po may be reduced where the interference is caused by the input signal S2 leaking through the parasitic capacitor of the turned-off transistor T1. In other words, the influence caused by unused paths of the amplifier circuit 100 upon the output terminal Po may be reduced.

Figure 2:
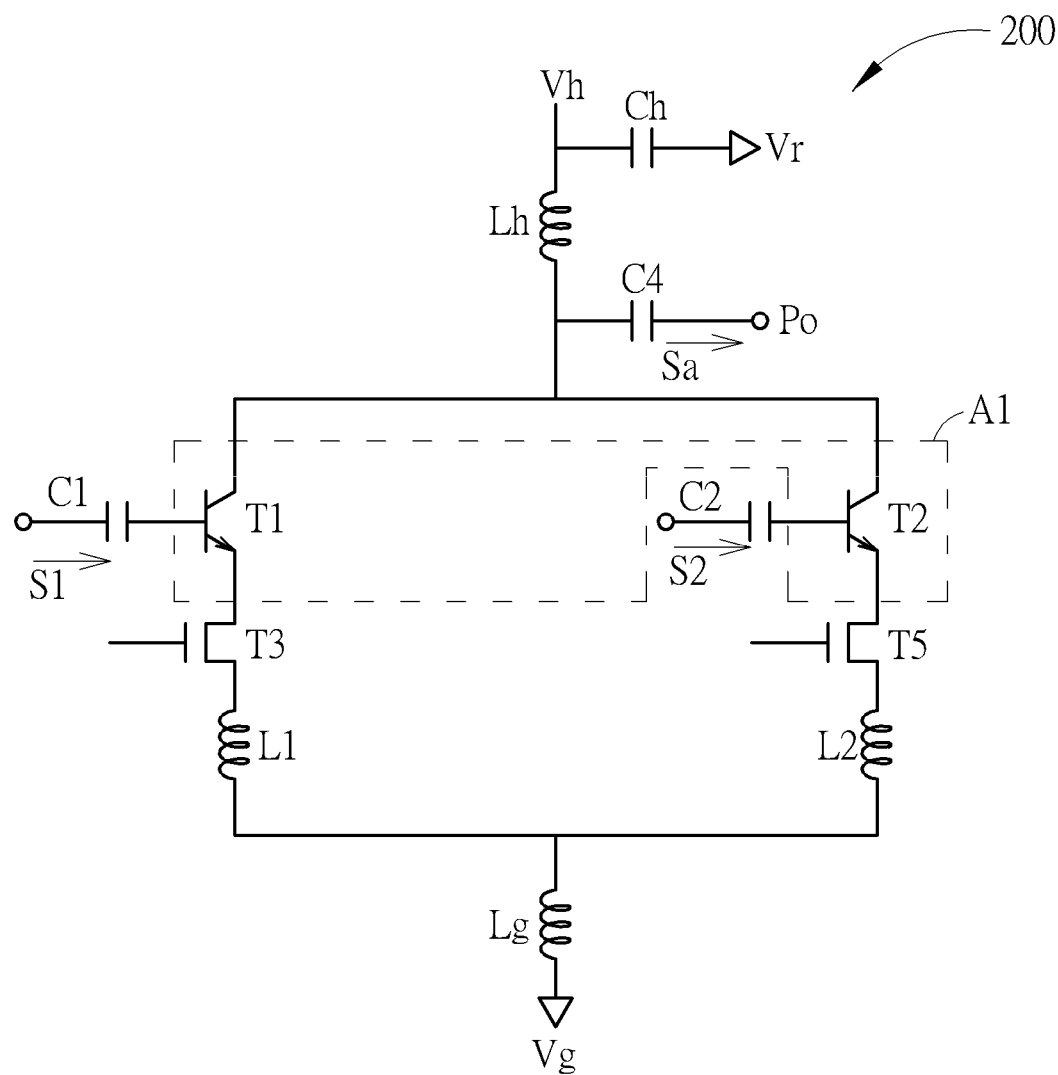
FIG. 2 illustrates an amplifier circuit according to another embodiment.

FIG. 2 illustrates an amplifier circuit 200 according to another embodiment. The amplifier circuit 200 may be similar to the amplifier circuit 100, but the amplifier circuit 200 may optionally include inductors L1 and L2. The inductor L1 may be coupled between the second terminal of the switch T3 and the first terminal of the inductor Lg. The inductor L2 may be coupled between the second terminal of the switch T5 and the first terminal of the inductor Lg. The inductors L1 and L2 may be used to respectively adjust impedance of a first input terminal of the amplifier circuit 200 and impedance of a second input terminal of the amplifier circuit 200.

Figure 3:
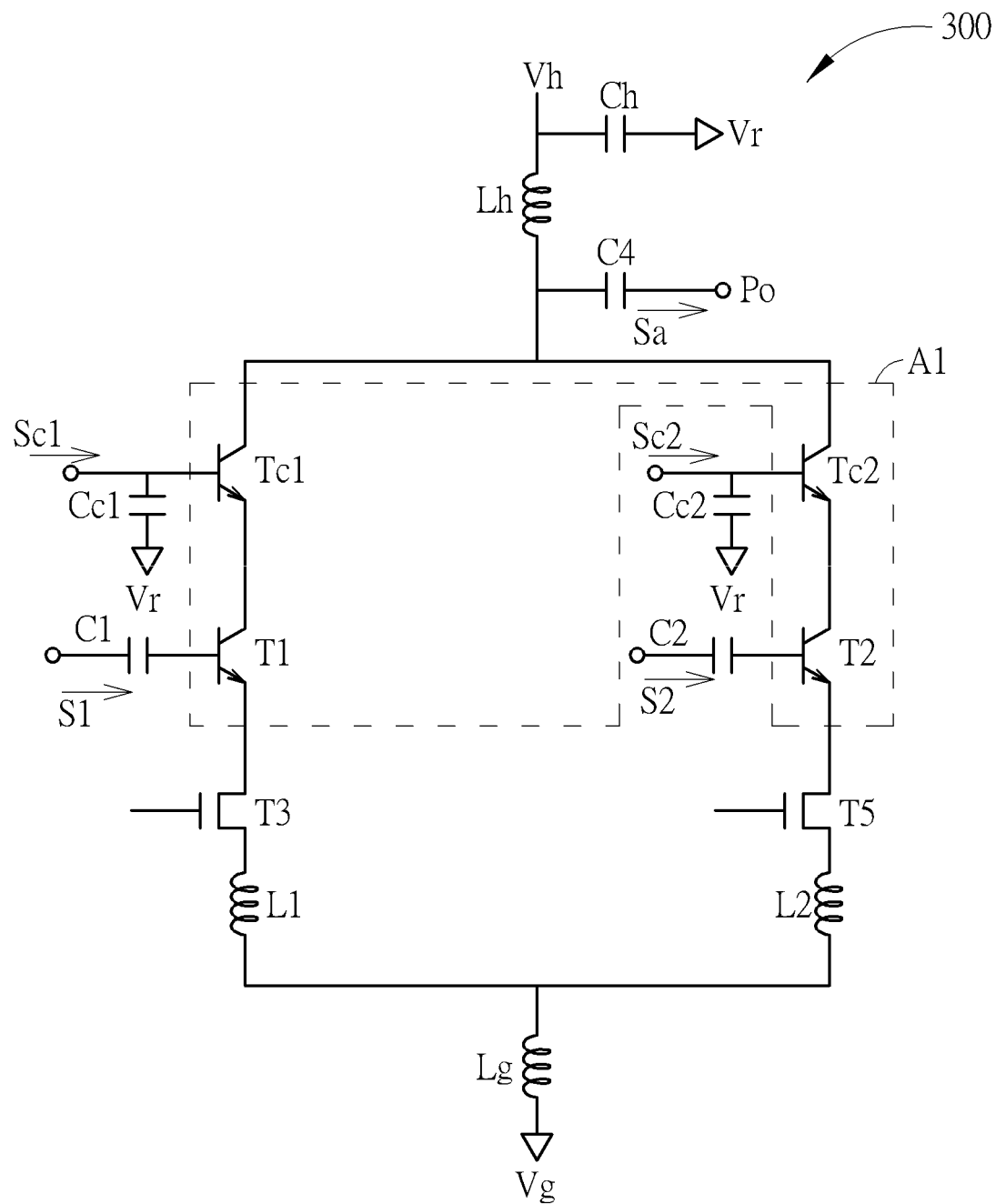
FIG. 3 illustrates an amplifier circuit according to another embodiment.

FIG. 3 illustrates an amplifier circuit 300 according to another embodiment. The amplifier circuit 300 may be similar to the amplifier circuit 200. However, in the amplifier circuit 300, the amplification unit A1 may further include transistors Tc1 and Tc2. The transistor Tc1 may include a first terminal and a second terminal where the first terminal may be coupled to the output terminal Po, and the second terminal may be coupled to the first terminal of the transistor T1. The transistor Tc2 may include a first terminal and a second terminal where the first terminal may be coupled to the output terminal Po, and the second terminal may be coupled to the first terminal of the transistor T2. According to an embodiment, the transistor Tc1 may further include a control terminal for receiving a bias control signal Sc1, and the control terminal may be coupled to the reference voltage terminal Vr through a capacitor Cc1. The bias control signal Sc1 may be used to turn on or turn off the transistor Tc1. The transistor Tc2 may further include a control terminal for receiving a bias control signal Sc2, and the control terminal may be coupled to the reference voltage terminal Vr through a capacitor Cc2. The bias control signal Sc2 may be used to turn on or turn off the transistor Tc2. The bias control signals Sc1 and Sc2 may be DC signals. The capacitors Cc1 and Cc2 may be AC short capacitors where AC signals may be allowed to pass through the capacitors Cc1 and Cc2.

As show in FIG. 3, the transistors Tc1 and T1 may form a cascode structure. Hence, the amplified input signal S1 may be outputted from the first terminal of the transistor Tc1. Likewise, the transistors Tc2 and T2 may form a cascode structure. Hence, the amplified input signal S2 may be outputted from the first terminal of the transistor Tc2. When the amplifier circuit 300 is used to amplify the input signal S1, the transistors T1 and Tc1 and the switch T3 may be turned on, and the transistors T2 and Tc2 and the switch T5 may be turned off. Because there may exist a parasitic capacitor between the first terminal and the control terminal of the turned-off transistor T2, the turned-off transistor Tc2 may make it difficult for the amplified input signal S1 to further leak to the control terminal of the transistor T2 through the parasitic capacitor of the turned-off transistor T2. Hence, it may be reduced that the control terminal of the transistor T1 and the control terminal of the transistor T2 interfere with one another. In other words, the isolation between the first input terminal and the second input terminal of the amplifier circuit 300 may be improved, and the reverse isolation capability of the amplifier circuit 300 may be improved. Likewise, when the amplifier circuit 300 is used to amplify the input signal S2, the transistors T1 and Tc1 and the switch T3 may be turned off, and the transistors T2 and Tc2 and the switch T5 may be turned on. The effects and operation principles of the circuit may be similar to that when the input signal S1 is amplified, so it is not repeatedly described.

Figure 4:
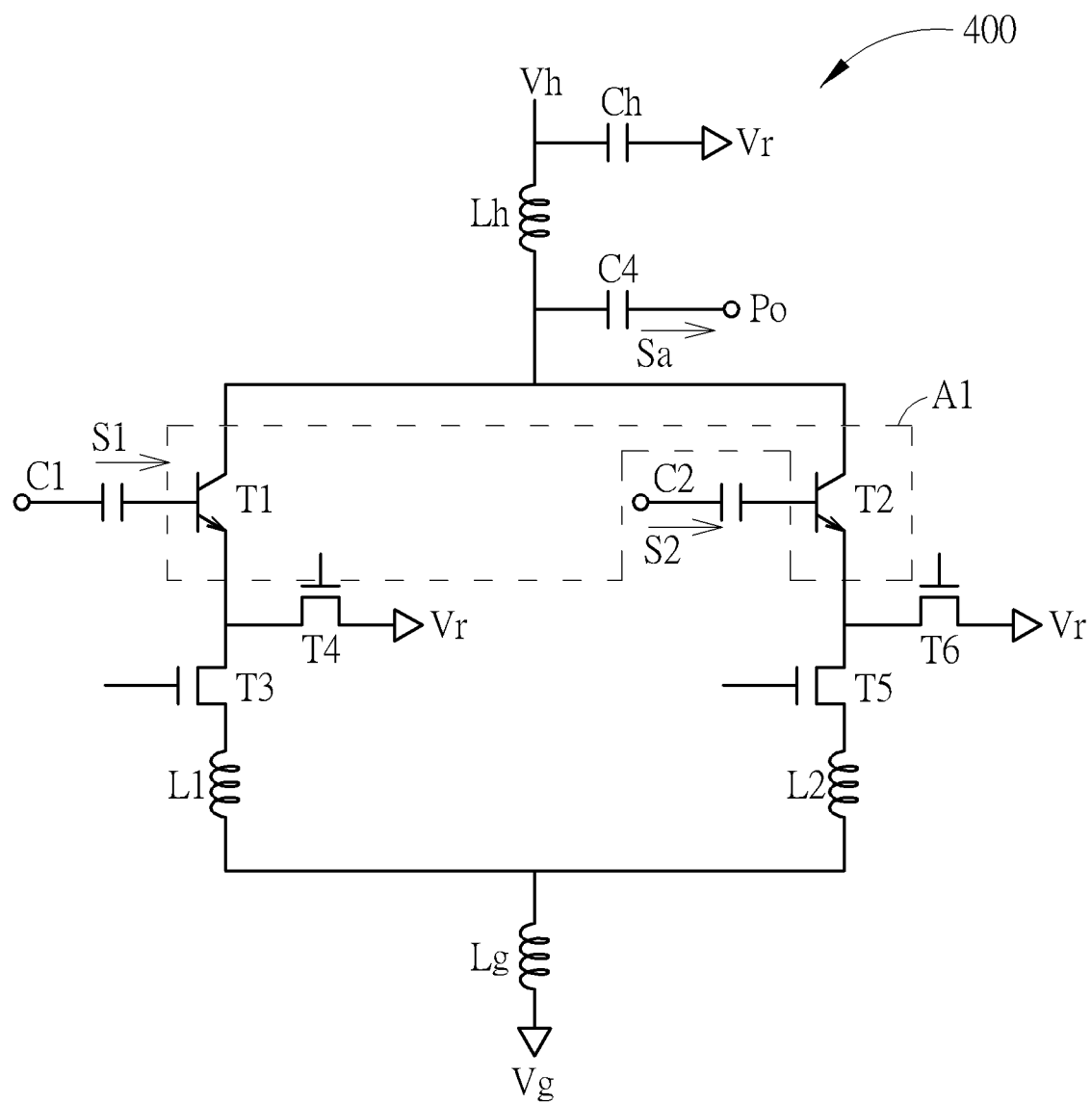
FIG. 4 illustrates an amplifier circuit according to another embodiment.

FIG. 4 illustrates an amplifier circuit 400 according to another embodiment. The amplifier circuit 400 may be similar to the amplifier circuit 200, but the amplifier circuit 400 may further include switches T4 and T6. The switch T4 may include a first terminal and a second terminal where the first terminal may be coupled to the second terminal of the transistor T1, and the second terminal may be coupled to the reference voltage terminal Vr. The switch T6 may include a first terminal and a second terminal where the first terminal may be coupled to the second terminal of the transistor T2, and the second terminal may be coupled to the reference voltage terminal Vr.

In the embodiment of FIG. 4, when the amplifier circuit 400 is used to amplify the input signal S1, the transistor T1 and the switches T3 and T6 may be turned on, and the transistor T2 and the switches T5 and T4 may be turned off. Because there may exist a parasitic capacitor between the first terminal and the second terminal of the turned-off switch T5, when the input signal S1 still leaks toward the transistor T2 through the parasitic capacitor of the turned-off switch T5, the input signal S1 leaking toward the transistor T2 may be shunted to the reference voltage terminal Vr by turning on the switch T6. It may be difficult for the input signal S1 to further leak to the transistor T2. The switch T4 may be turned off when the switch T3 is turned on, and the switch T4 may be turned on when the switch T3 is turned off. In other words, a voltage level of a control terminal of the switch T3 and a voltage level of a control terminal of the switch T4 may be inverted with one another. For example, the voltage level of the control terminal of the switch T3 may be a high level when the voltage level of the control terminal of the switch T4 is a low level, and the voltage level of the control terminal of the switch T3 may be a low level when the voltage level of the control terminal of the switch T4 is a high level. Likewise, when the amplifier circuit 400 is used to amplify the input signal S2, the transistor T1 and the switches T3 and T6 may be turned off, and the transistor T2 and the switches T5 and T4 may be turned on. The effects and operation principles of the circuit may be similar to that when the input signal S1 is amplified, so it is not repeatedly described.

Figure 5:
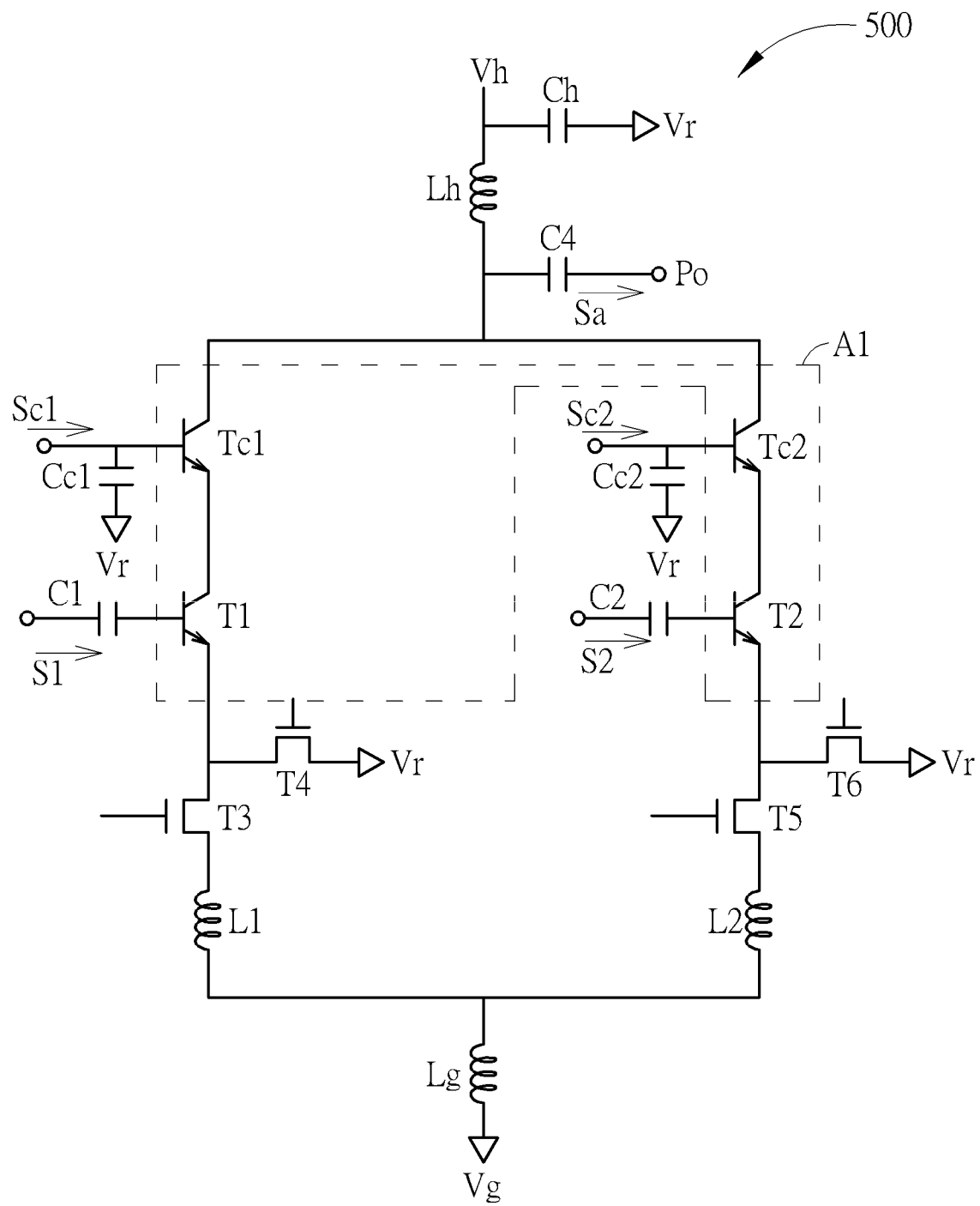
FIG. 5 illustrates an amplifier circuit according to another embodiment.

FIG. 5 illustrates an amplifier circuit 500 according to another embodiment. The amplifier circuit 500 may be similar to the amplifier circuit 400. However, in the amplifier circuit 500, the amplification unit A1 may further include transistors Tc1 and Tc2. The transistors Tc1 and T1 may form a cascode structure. The transistors Tc2 and T2 may form a cascode structure. The couplings, effects and operation principles related to the transistors Tc1 and Tc2 may be similar to that of FIG. 3, so it is not repeatedly described.

Figure 6:
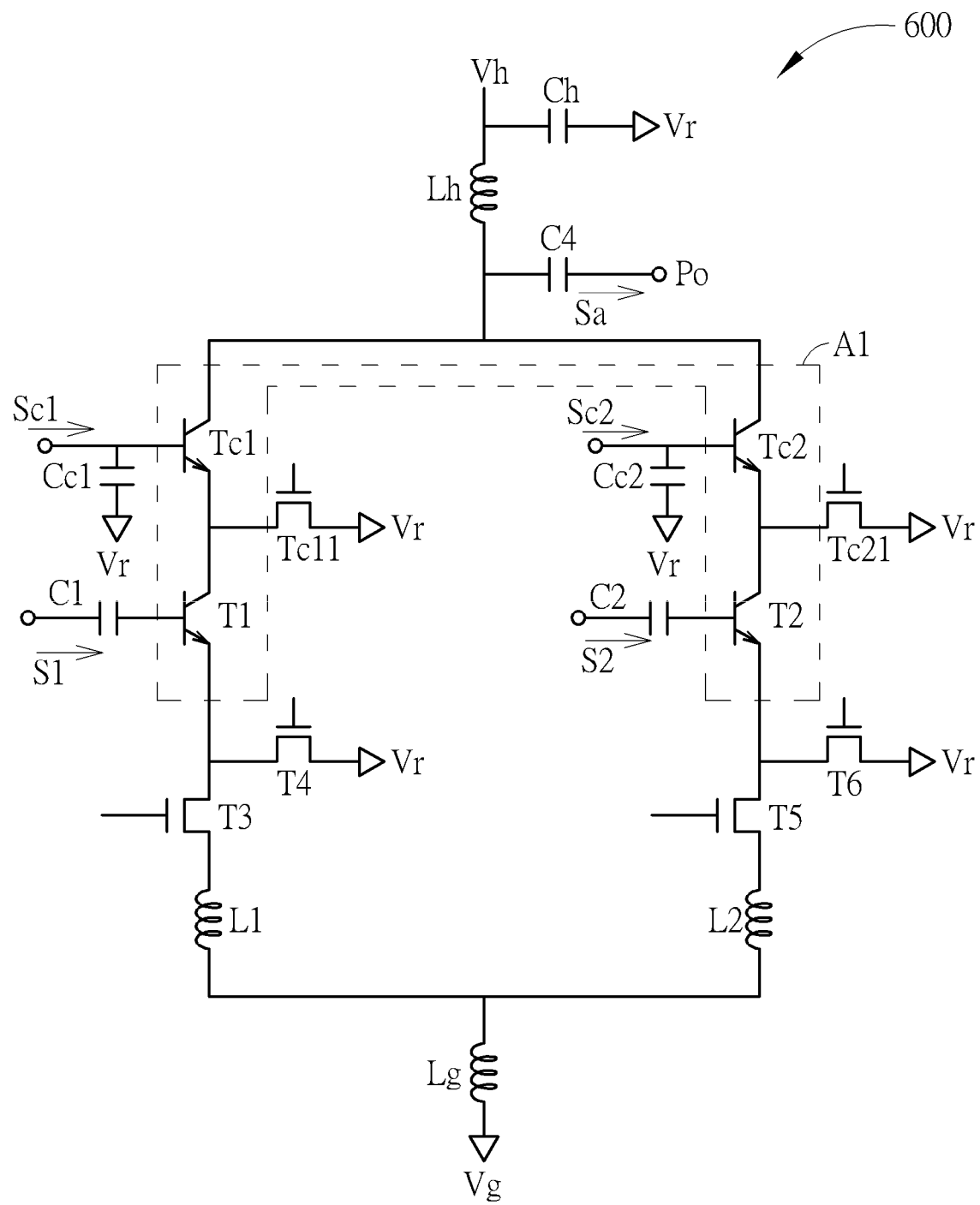
FIG. 6 illustrates an amplifier circuit according to another embodiment.

FIG. 6 illustrates an amplifier circuit 600 according to another embodiment. The amplifier circuit 600 may be similar to the amplifier circuit 500, but the amplifier circuit 600 may further include switches Tc11 and Tc21. The switch Tc11 may include a first terminal and a second terminal where the first terminal may be coupled to the first terminal of the transistor T1, and the second terminal may be coupled to the reference voltage terminal Vr. The switch Tc21 may include a first terminal and a second terminal where the first terminal may be coupled to the first terminal of the transistor T2, and the second terminal may be coupled to the reference voltage terminal Vr. When the amplifier circuit 600 is used to amplify the input signal S1, the transistors T1 and Tc1 and the switches T3, T6 and Tc21 may be turned on, and the transistors T2 and Tc2 and the switches T5, T4 and Tc11 may be turned off.

Because there may exist a parasitic capacitor between the first terminal and the second terminal of each of the turned-off transistors T2 and Tc2, when the input signal S1 is too strong and further leaks toward the transistor Tc2 through the parasitic capacitor of the turned-off transistor T2, the input signal S1 leaking toward the transistor Tc2 may be shunted to the reference voltage terminal Vr by turning on the switch Tc21. Hence, it may be difficult for the input signal S1 to further leak to the output terminal Po through the parasitic capacitor of the turned-off transistor Tc2, and the interference with the output terminal Po may be reduced where the interference is caused by the input signal S1 leaking through the parasitic capacitor of the turned-off transistor Tc2. In other words, the influence caused by unused paths of the amplifier circuit 600 upon the output terminal Po may be reduced. Furthermore, by means of shunting the input signal S1 to the reference voltage terminal Vr by turning on the switch Tc21, unwanted conduction caused by the input signal S1 changing a voltage between the control terminal and the second terminal of the transistor Tc2 may be reduced, and the influence upon performance of the amplifier circuit 600 may be reduced. The switches T4 and Tc11 may be turned off when the switch T3 is turned on, and the switches T4 and Tc11 may be turned on when the switch T3 is turned off. In other words, a voltage level of the control terminal of the switch T3 may be inverted with voltage levels of the control terminals of the switches T4 and Tc11 according to an embodiment. Likewise, when the amplifier circuit 600 is used to amplify the input signal S2, the transistors T1 and Tc1 and the switches T3, T6 and Tc21 may be turned off, and the transistors T2 and Tc2 and the switches T5, T4 and Tc11 may be turned on. The related effects and operation principles may be similar to that when amplifying the input signal S1, so it is not repeatedly described.

As shown in FIG. 1 to FIG. 6, the amplifier circuits 100 to 600 may be used to process the input signals S1 and S2. However, the disclosure is not limited hereto. According to another embodiment of the disclosure, an amplifier circuit may process more input signals by expanding the circuit as needed.

Figure 7:
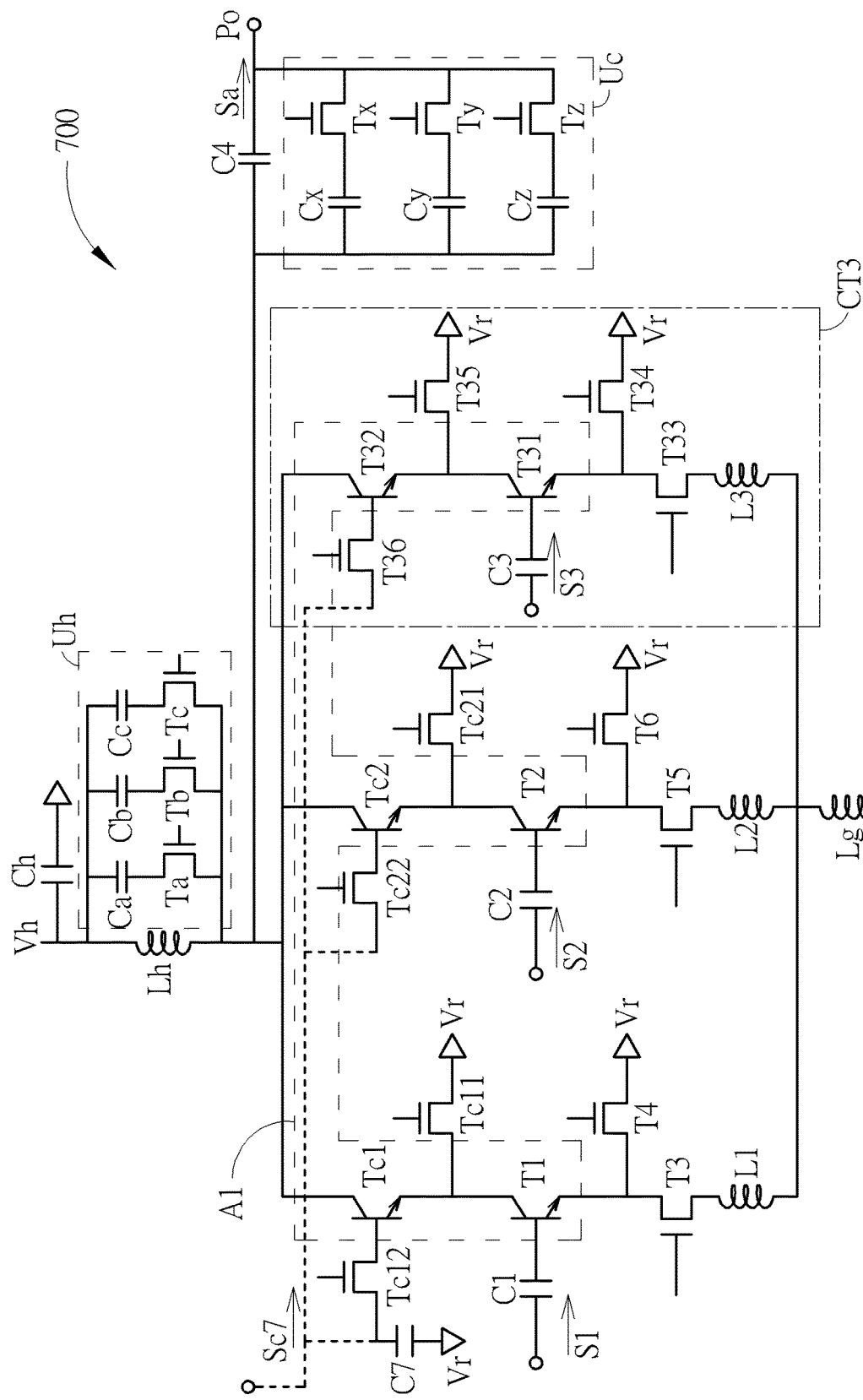
FIG. 7 illustrates an amplifier circuit according to another embodiment.

FIG. 7 illustrates an amplifier circuit 700 according to another embodiment. The amplifier circuit 700 may be similar to the amplifier circuit 600, but the amplifier circuit 700 may further include a circuit CT3. The circuit CT3 may include transistors T31 and T32. The transistor T31 may include a control terminal, a first terminal and a second terminal where the control terminal may be a third input terminal of the amplifier circuit 700 for receiving an input signal S3. The transistor T32 may include a control terminal, a first terminal and a second terminal where the first terminal may be coupled to the output terminal Po, and the second terminal may be coupled to the first terminal of the transistor T31. The transistors T31 and T32 may form a cascode structure, so the first terminal of the transistor T32 may be used to output an amplified input signal S3. In other words, in FIG. 7, the amplification unit A1 may further include the transistors T31 and T32. Furthermore, the circuit CT3 may optionally further include a capacitor C3, an inductor L3, switches T33, T34 and T35. The couplings, effects and operation principles of the circuit related to the capacitor C3, the inductor L3, the switches T33, T34 and T35 may be similar to that of the capacitor C1, the inductor L1 and the switches T3, T4 and Tc11 of FIG. 6 or be similar to that of the capacitor C2, the inductor L2 and the switches T5, T6 and Tc21 of FIG. 6, so it is not repeatedly described.

In FIG. 6, the control terminals of the transistors Tc1 and Tc2 may be coupled to the reference voltage terminal Vr through the capacitors Cc1 and Cc2 respectively. However, in FIG. 7, the amplifier circuit 700 may further include switches Tc12, Tc22 and T36 and a capacitor C7. Each of the switches Tc12, Tc22 and T36 may have a first terminal and a second terminal. The first terminals of the switches Tc12, Tc22 and T36 may be respectively coupled to the control terminals of the corresponding transistors Tc1, Tc2 and T32. The second terminals of the switches Tc12, Tc22 and T36 may all be coupled to a first terminal of the capacitor C7, and a second terminal of the capacitor C7 may be coupled to the reference voltage terminal Vr. For the switches Tc12, Tc22 and T36, the capacitor C7 may be a shared AC short capacitor. By sharing the capacitor C7, the size of the circuit may be reduced.

Furthermore, the second terminals of the switches Tc12, Tc22 and T36 may further be used to receive a bias control signal Sc7. By turning on or turning off the switches Tc12, Tc22 and T36, the bias control signal Sc7 may be sent or not sent to the control terminals of the corresponding transistors Tc1, Tc2 and T32, and the transistors Tc1, Tc2 and T32 may be turned on or off accordingly. The bias control signal Sc7 may be a DC signal. For example, when the amplifier circuit 700 is used to amplify the input signal S1, the transistors T1 and Tc1 and the switches T3, T6, Tc21, T34, T35 and Tc12 may be turned on, and the transistors T2, Tc2, T31 and T32 and the switches T5, T33, T4, Tc11, Tc22 and T36 may be turned off. When the amplifier circuit 700 is used to amplify the input signal S2, the transistors T1, Tc1, T31 and T32 and the switches T3, T33, T6, Tc21, Tc12 and T36 may be turned off, and the transistors T2 and Tc2 and the switches T5, T4, Tc11, T34, T35 and Tc22 may be turned on. When the amplifier circuit 700 is used to amplify the input signal S3, the transistor T1, Tc1, T2 and Tc2 and the switches T3, T5, T34, T35, Tc12 and Tc22 may be turned off, and the transistors T31 and T32 and the switches T33, T4, Tc11, T6, Tc21 and T36 may be turned on.

As shown in FIG. 7, the amplifier circuit 700 may optionally further include an inductance adjustment unit Uh and a capacitance adjustment unit Uc. The inductance adjustment unit Uh may be in parallel with the inductor Lh. The inductance adjustment unit Uh may include switches Ta, Tb and Tc and capacitors Ca, Cb and Cc. By turning on or turning off the switches Ta, Tb and/or Tc, the loading between the two terminals of the inductor Lh may be adjusted. Likewise, the capacitance adjustment unit Uc may be in parallel with the capacitor C4. The capacitance adjustment unit Uc may include switches Tx, Ty and Tz and capacitors Cx, Cy and Cz. By turning on or turning off the switches Tx, Ty and/or Tz, the loading between the two terminals of the capacitor C4 may be adjusted. In FIG. 7, the number of the switches and the number of the capacitors in the inductance adjustment unit Uh and the capacitance adjustment unit Uc may merely be an example, and a user may increase or decrease the number according to required accuracy or loading range.

Figure 8:
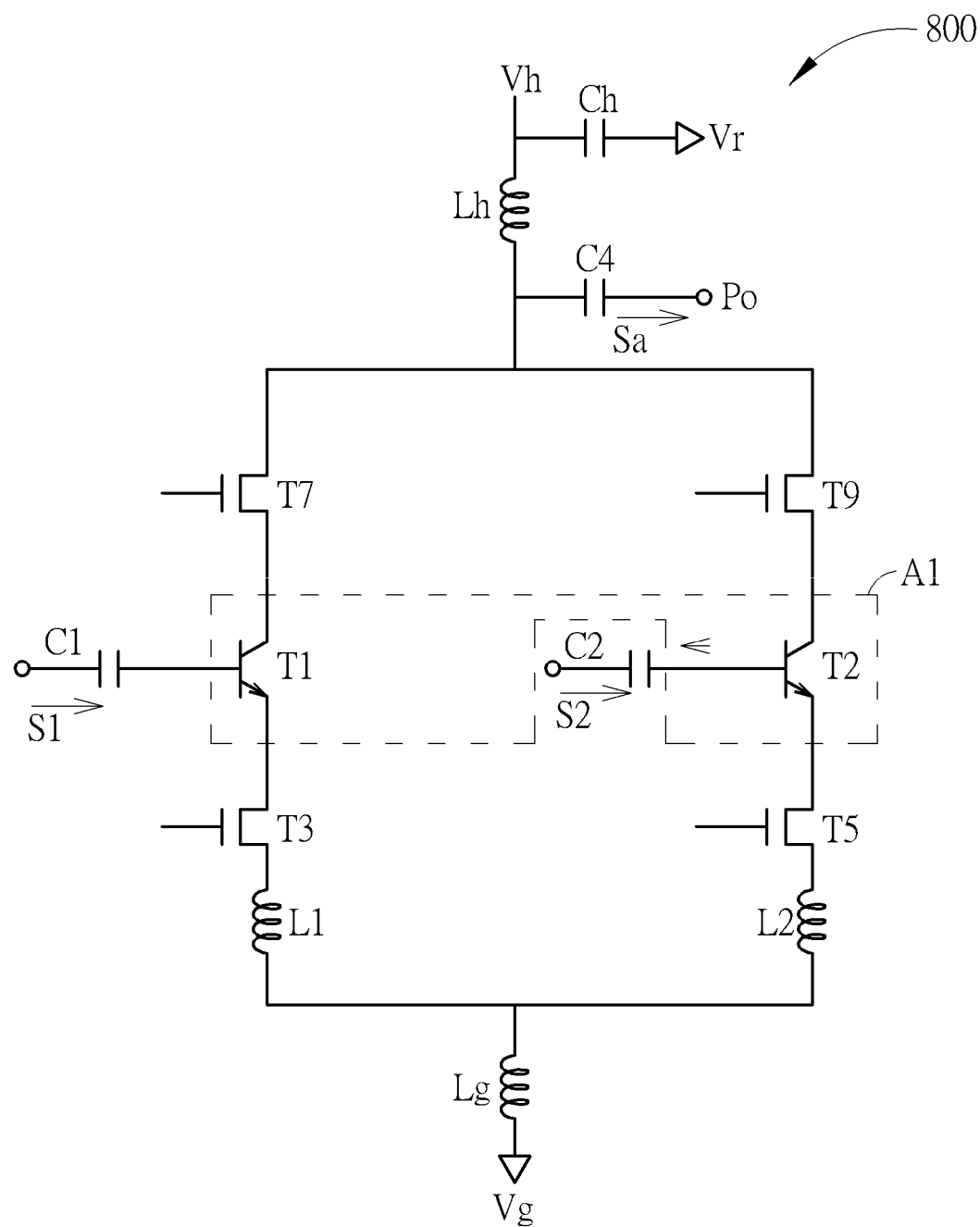
FIG. 8 illustrates an amplifier circuit according to another embodiment.

FIG. 8 illustrates an amplifier circuit 800 according to another embodiment. The amplifier circuit 800 may be similar to the amplifier circuit 200 of FIG. 2. However, the amplifier circuit 800 may optionally further include switches T7 and T9 as compared with the amplifier circuit 200. The switch T7 may include a first terminal and a second terminal where the first terminal may be coupled to the output terminal Po, and the second terminal may be coupled to the first terminal of the transistor T1. The switch T9 may include a first terminal and a second terminal where the first terminal may be coupled to the output terminal Po, and the second terminal may be coupled to the first terminal of the transistor T2.

In FIG. 8, when the amplifier circuit 800 is used to amplify the input signal S1, the transistor T1 and the switches T3 and T7 may be turned on, and the transistor T2 and the switches T5 and T9 may be turned off. Because there may exist a parasitic capacitor between the first terminal and the second terminal of each of the turned-off transistor T2 and switch T5, when the input signal S1 still leaks to the transistor T2 through the parasitic capacitor of the turned-off switch T5, the turned-off switch T9 may make it difficult for the input signal S1 to further leak to the output terminal Po through the parasitic capacitor of the turned-off transistor T2. Hence, the interference with the output terminal Po may be reduced where the interference is caused by the input signal S1 leaking through the parasitic capacitor of the turned-off transistor T2. In other words, the influence caused by unused paths of the amplifier circuit 800 upon the output terminal Po may be reduced. Furthermore, because there may further exist another parasitic capacitor between the first terminal and the control terminal of the turned-off transistor T2, the turned-off switch T9 may make it difficult for the amplified input signal S1 to further leak to the control terminal of the transistor T2 through the parasitic capacitor of the turned-off transistor T2. Hence, it may be reduced that the control terminal of the transistor T1 and the control terminal of the transistor T2 interfere with one another. In other words, the isolation between the first input terminal and the second input terminal of the amplifier circuit 800 may be improved, and the reverse isolation capability of the amplifier circuit 800 may be improved. Likewise, when the amplifier circuit 800 is used to amplify the input signal S2, the transistor T2 and the switches T5 and T9 may be turned on, and the transistor T1 and the switches T3 and T7 may be turned off. The effects and operation principles of the circuit may be similar to that when amplifying the input signal S1, so it is not repeatedly described.

Figure 9:
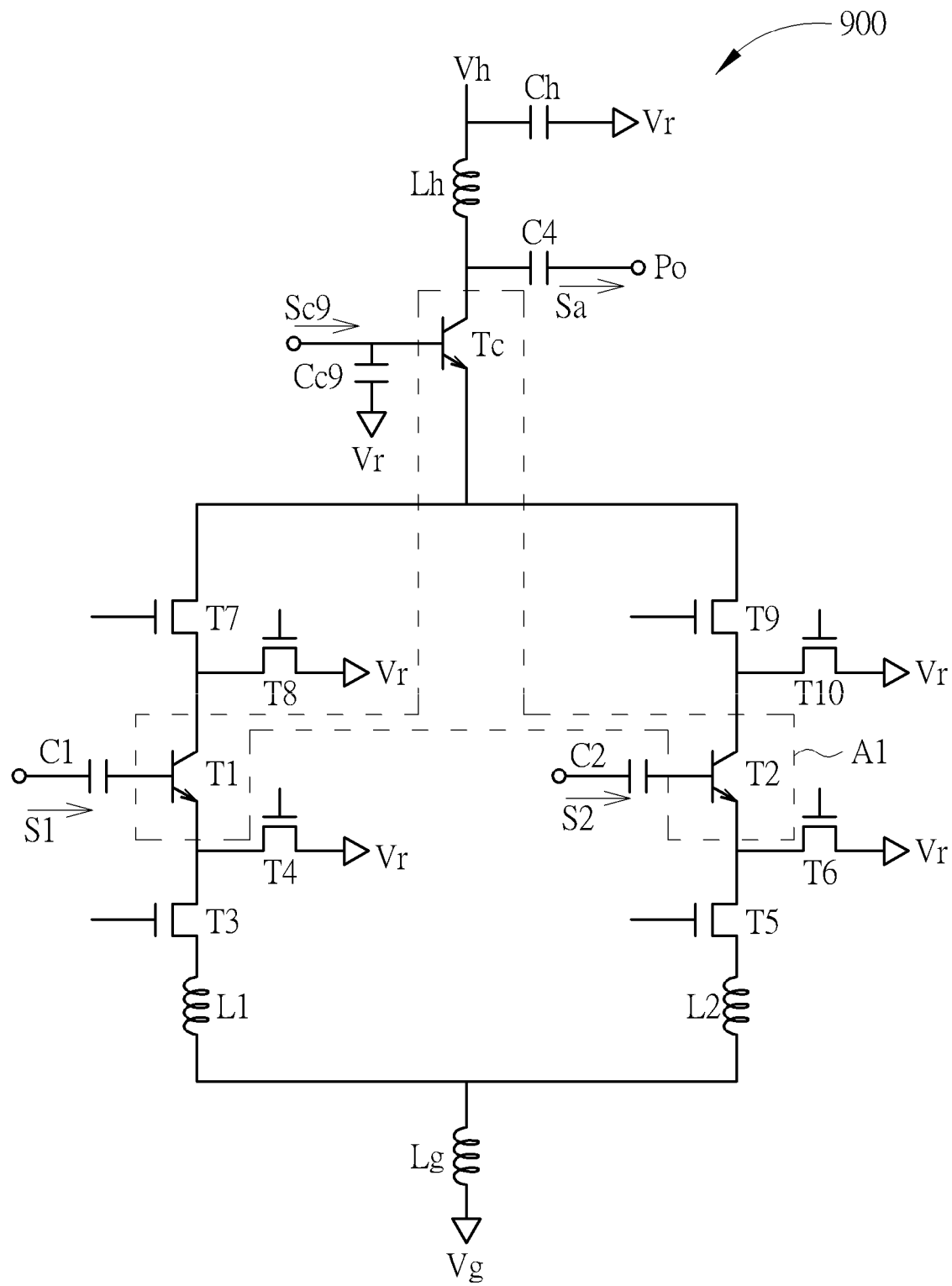
FIG. 9 illustrates an amplifier circuit according to another embodiment.

FIG. 9 illustrates an amplifier circuit 900 according to another embodiment. The amplifier circuit 900 may be similar to the amplifier circuit 800. However, the amplifier circuit 900 may optionally further include not only the switches T4 and T6 shown in FIG. 4 but also switches T8 and T10 shown in FIG. 9. Furthermore, the amplification unit A1 of the amplifier circuit 900 may optionally further include a transistor Tc. The switch T8 may include a first terminal and a second terminal where the first terminal may be coupled to the first terminal of the transistor T1 and the second terminal may be coupled to the reference voltage terminal Vr. The switch T10 may include a first terminal and a second terminal where the first terminal may be coupled to the first terminal of the transistor T2 and the second terminal may be coupled to the reference voltage terminal Vr. The transistor Tc may include a first terminal and a second terminal where the first terminal may be coupled to the output terminal Po and the second terminal may be coupled to the first terminal of the switch T7 and the first terminal of the switch T9. The transistor Tc may further include a control terminal to receive a bias control signal Sc9 and be coupled to the reference voltage terminal Vr through a capacitor Cc9. The bias control signal Sc9 may be a DC signal for turning on or turning off the transistor Tc. The capacitor Cc9 may be an AC short capacitor. According to other embodiments, the amplification unit A1 of each of the amplifier circuits 100 to 800 may optionally further include the transistor Tc.

In the embodiment of FIG. 9, when the amplifier circuit 900 is used to amplify the input signal S1, the transistors T1 and Tc and the switches T3, T7, T6 and T10 may be turned on, and the transistor T2 and the switches T5, T9, T4 and T8 may be turned off. In this condition, the transistors Tc and T1 may form a cascode structure. Hence, the amplified input signal S1 may be outputted from the first terminal of the transistor Tc. Because there may exist a parasitic capacitor between the first terminal and the second terminal of each of the turned-off transistor T2 and switch T5, when the input signal S1 still leaks toward the transistor T2 through the parasitic capacitor of the turned-off switch T5, the input signal S1 leaking toward the transistor T2 may be shunted to the reference voltage terminal Vr by turning on the switch T6. Unwanted conduction caused by the input signal S1 changing a voltage between the control terminal and the second terminal of the transistor T2 may be reduced, and it may be reduced that the control terminal of the transistor T1 and the control terminal of the transistor T2 interfere with one another. In other words, the isolation between the first input terminal and the second input terminal of the amplifier circuit 900 may be improved. When the input signal S1 is too strong and further leaks toward the transistor Tc through the parasitic capacitor of the turned-off transistor T2, by turning on the switch T10, the input signal S1 leaking toward the transistor Tc may be further shunted to the reference voltage terminal Vr, the intensity of the input signal S1 may be greatly attenuated. It may be more difficult for the input signal S1 to leak to the transistor Tc, and the performance of the amplifier circuit 900 may be less affected. Moreover, when the input signal S1 is too strong and still leaks toward the transistor Tc through the parasitic capacitor of the turned-off transistor T2, by turning off the switch T9, it may be more difficult for the input signal S1 to further leak to the transistor Tc, and the performance of the amplifier circuit 900 may be less affected. Furthermore, because there may further exist another parasitic capacitor between the first terminal and the control terminal of the turned-off transistor T2, the turned-off switch T9 may make it difficult for the amplified input signal S1 to further leak to the control terminal of the transistor T2 through the turned-on transistor Tc and the parasitic capacitor of the turned-off transistor T2. Considering that a parasitic capacitor exists between the first terminal and the second terminal of the turned-off switch T9, in order to better reduce that the amplified input signal S1 leaks toward the control terminal of the transistor T2 through the turned-on transistor Tc and the parasitic capacitor of the turned-off switch T9, the amplified input signal S1 leaking toward the control terminal of the transistor T2 may be shunted to the reference voltage terminal Vr by turning on the switch T10, and it may be more difficult for the amplified input signal S1 to further leak to the control terminal of the transistor T2. It may be reduced for the control terminal of the transistor T1 and the control terminal of the transistor T2 to interfere with one another. In other words, the isolation between the first input terminal and the second input terminal of the amplifier circuit 900 may be improved, and the reverse isolation capability of the amplifier circuit 900 may be improved. When the switch T3 is turned on, the switches T4 and T8 may be turned off, and when the switch T3 is turned off, the switches T4 and T8 may be turned on. In other words, a voltage level of the control terminal of the switch T3 may be inverted with voltage levels of the control terminals of the switches T4 and T8 according to an embodiment. Likewise, when the amplifier circuit 900 is used to amplify the input signal S2, the transistors T2 and Tc and the switches T5, T9, T4 and T8 may be turned on, and the transistor T1 and the switches T3, T7, T6 and T10 may be turned off. In this condition, the transistors Tc and T2 may form a cascode structure. Hence, the amplified input signal S2 may be outputted from the first terminal of the transistor Tc. The effects and operation principles of the circuit may be similar to that when the input signal S1 is amplified, so it is not repeatedly described. In the embodiment of FIG. 9, by sharing the transistor Tc, the size of the circuit may be reduced.

Figure 10:
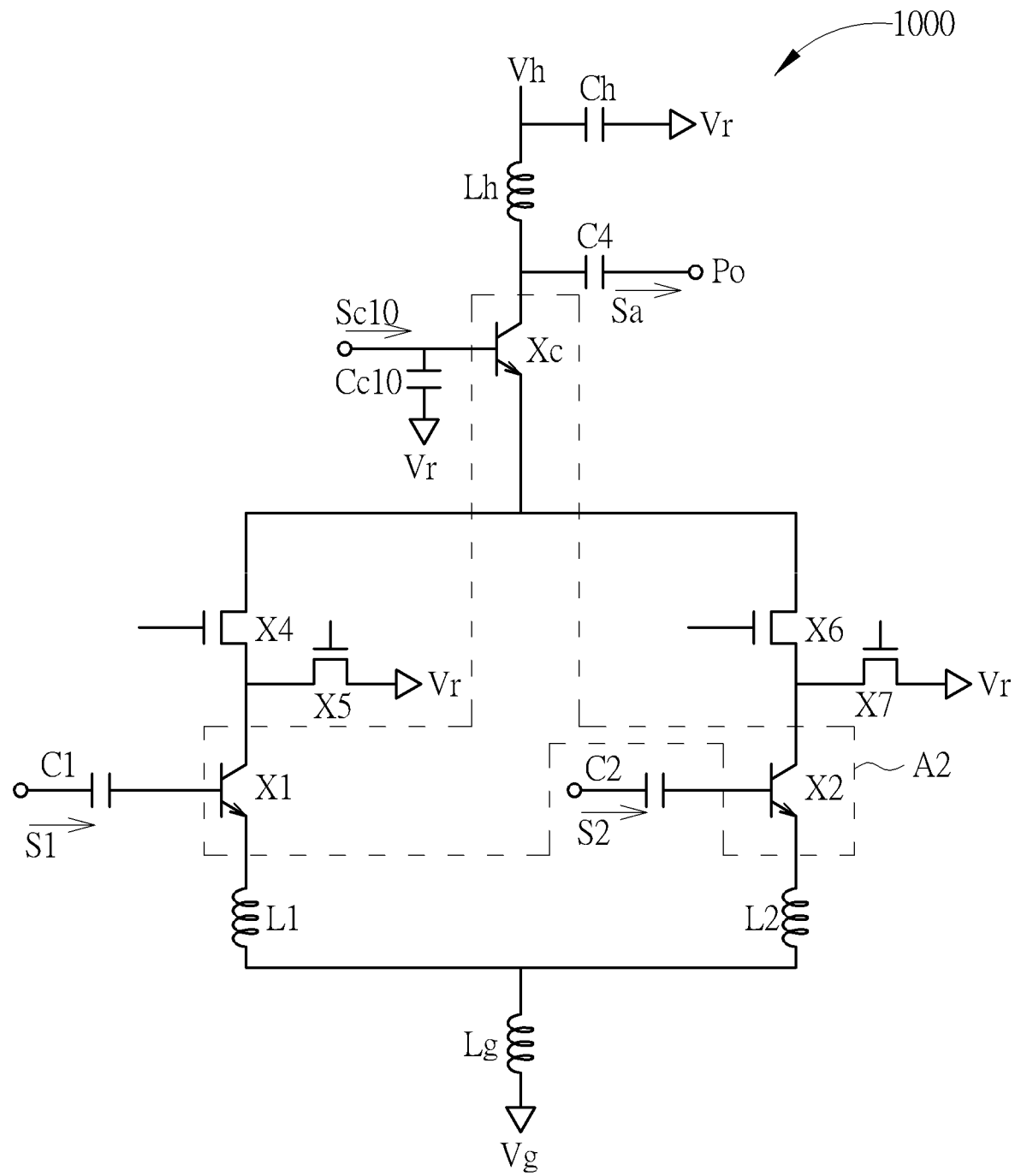
FIG. 10 illustrates an amplifier circuit according to another embodiment.

FIG. 10 illustrates an amplifier circuit 1000 according to another embodiment. The amplifier circuit 1000 may include an amplification unit A2. The amplification unit A2 may include transistors X1, X2 and Xc. The transistor X1 may include a control terminal, a first terminal and a second terminal where the control terminal may be used as a first input terminal of the amplifier circuit 1000 for receiving an input signal S1, and the first terminal may be coupled to an output terminal Po for outputting an amplified input signal S1. The transistor X2 may include a control terminal, a first terminal and a second terminal where the control terminal may be used as a second input terminal of the amplifier circuit 1000 for receiving an input signal S2, and the first terminal may be coupled to the output terminal Po for outputting an amplified input signal S2. The transistor Xc may be coupled between the output terminal Po and the transistor X1 and be coupled between the output terminal Po and the transistor X2. Further, the transistor Xc may include a first terminal and a second terminal where the first terminal may be coupled to the output terminal Po. The transistor Xc may further include a control terminal used to receive a bias control signal Sc10 and coupled to the reference voltage terminal Vr through a capacitor Cc10. The bias control signal Sc10 may be a DC signal for turning on or turning off the transistor Xc. The capacitor Cc10 may be an AC short capacitor. The output terminal Po may be used to output an amplification signal Sa, and the amplification signal Sa may be generated using at least the amplified input signal S1 and/or the amplified input signal S2.

As shown in FIG. 10, the amplifier circuit 1000 may optionally further include switches X4 and X6. The switch X4 may include a first terminal and a second terminal where the first terminal may be coupled to the second terminal of the transistor Xc, and the second terminal may be coupled to the first terminal of the transistor X1. The transistor X6 may include a first terminal and a second terminal where the first terminal may be coupled to the second terminal of the transistor Xc and the second terminal may be coupled to the first terminal of the transistor X2.

As shown in FIG. 10, the amplifier circuit 1000 may optionally further include switches X5 and X7. The switch X5 may include a first terminal and a second terminal where the first terminal may be coupled to the first terminal of the transistor X1, and the second terminal may be coupled to the reference voltage terminal Vr. The transistor X7 may include a first terminal and a second terminal where the first terminal may be coupled to the first terminal of the transistor X2 and the second terminal may be coupled to the reference voltage terminal Vr.

In the embodiment of FIG. 10, when the amplifier circuit 1000 is used to amplify the input signal S1, the transistors X1 and Xc and the switches X4 and X7 may be turned on, and the transistor X2 and the switches X6 and X5 may be turned off. In this condition, the transistors Xc and X1 may form a cascode structure. Hence, the amplified input signal S1 may be outputted from the first terminal of the transistor Xc. Because the second terminal of the transistor X1 and the second terminal of the transistor X2 may form a common structure, and there may exist a parasitic capacitor between the first terminal and the second terminal of the turned-off transistor X2, when the input signal S1 leaks toward the transistor Xc through the parasitic capacitor of the turned-off transistor X2, by turning on the switch X7, the input signal S1 leaking toward the transistor Xc may be shunted to the reference voltage terminal Vr. The intensity of the input signal S1 may be attenuated to make it difficult for the input signal S1 to leak to the transistor Xc. When the input signal S1 still leaks toward the transistor Xc through the parasitic capacitor of the turned-off transistor X2, the turned-off switch X6 may further raise the difficulty for the input signal S1 to leak to the transistor Xc so that the performance of the amplifier circuit 1000 may be less affected. Furthermore, because there may exist another parasitic capacitor between the first terminal and the control terminal of the turned-off transistor X2, the turned-off switch X6 may make it difficult for the amplified input signal S1 to leak to the control terminal of the transistor X2 through the turned-on transistor Xc and the parasitic capacitor of the turned-off transistor X2. Considering that a parasitic capacitor exists between the first terminal and the second terminal of the turned-off switch X6, in order to better reduce that the amplified input signal S1 leaks toward the control terminal of the transistor X2 through the turned-on transistor Xc and the parasitic capacitor of the turned-off switch X6, the amplified input signal S1 leaking toward the control terminal of the transistor X2 may be shunted to the reference voltage terminal Vr by turning on the switch X7, and it may be more difficult for the amplified input signal S1 to further leak to the control terminal of the transistor X2. Hence, the interference between the control terminal of the transistor X1 and the control terminal of the transistor X2 is reduced. In other words, the isolation between the first input terminal and the second input terminal of the amplifier circuit 1000 is improved, and the reverse isolation capability is improved. When the switch X4 is turned on, the switch X5 may be turned off, and when the switch X4 is turned off, the switch X5 may be turned on. In other words, a voltage level of the control terminal of the switch X4 may be inverted with a voltage level of the control terminal of the switch X5 according to an embodiment. Likewise, when the amplifier circuit 1000 is used to amplify the input signal S2, the transistor X1 and the switches X4 and X7 may be turned off, and the transistors X2 and Xc and the switches X6 and X5 may be turned on. In this condition, the transistors Xc and X2 may form a cascode structure. Hence, the amplified input signal S2 may be outputted from the first terminal of the transistor Xc. The effects and operation principles of the circuit may be similar to that when amplifying the input signal S1, so it is not repeatedly described. In the embodiment of FIG. 10, by sharing the transistor Xc, the size of the circuit is reduced.

As in FIG. 2 to FIG. 9, the amplifier circuit 1000 may further include the inductors Lh and Lg and the capacitor Ch, and may optionally further include the capacitors C1, C2 and C4 and the inductors L1 and L2. The effects and operation principles of the circuit may be similar to that in FIG. 2 to FIG. 9, so it is not repeatedly described.

Each of the foresaid transistors may be (but not limited to) a bipolar junction transistor (BJT) or a metal-oxide-semiconductor field-effect transistor (MOSFET). When a transistor is a BJT, a first terminal of the transistor may be one of a collector terminal and an emitter terminal, a second terminal may be another one of the collector terminal and the emitter terminal, and a control terminal may be a base terminal. When a transistor is a MOSFET, a first terminal of the transistor may be one of a drain terminal and a source terminal, a second terminal may be another one of the drain terminal and the source terminal, and a control terminal may be a gate terminal. Each of the foresaid switches may be a transistor switch or an appropriate controllable switch element which can be turned on and turned off. A switch may be controlled to be turned on or turned off by means of logic signals. For example, when a logic signal is of a high level (e.g. 1), the logic signal may be used to turn on a switch; and when a logic signal is of a low level (e.g.0), the logic signal may be used to turn off a switch. The number of the input signals shown in each of FIG. 1 to FIG. 10 may be merely an example. According to embodiments, the number of input signals can be increased by expanding the circuit using more circuit components. For example, the circuit may be expanded as shown in FIG. 7.

In summary, the amplifier circuit provided by the embodiment may be used for processing multiple input signals such as the input signals S1, S2 and/or S3 shown in FIG. 1 to FIG. 10, so the amplifier circuit may support various operation modes. For example, when the amplifier circuit is used in a communication field, the amplifier circuit may be a low noise amplifier (LNA), the first signal S1 may be a signal of a first frequency band, the input signal S2 may be a signal of a second frequency band, and the input signal S3 may be a signal of a third frequency band. The first frequency band, the second frequency band and the third frequency band may be of different frequency bands. Hence, frequency bands of different input signals may be different, and the amplifier circuit may support amplification of signals of various frequency bands.

Furthermore, the isolation between a path in use and an unused path may be effectively improved by turning on and turning off switches in an amplifier circuit provided by an embodiment. For example, when the amplifier circuit is used to amplify a first input signal using a path (i.e. a path in use) instead of amplifying a second input signal using another path (i.e. an unused path), by turning on or turning off switches mentioned above, the first input signal may be reduced from leaking to the path used for amplifying the second input signal. The influence cause by an unused path upon an output terminal may hence be reduced. The isolation between an input terminal for receiving the first input signal and another input terminal for receiving the second input signal may be improved. The reverse isolation capability of the amplifier circuit may be improved. Hence, it is beneficial for suppressing return loss, suppressing noise figure, widening output frequency bands and reducing unwanted interference, and so on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit comprising:
an output terminal configured to output an amplification signal;
an amplification unit comprising:
a first transistor comprising a control terminal configured to receive a first input signal, a first terminal coupled to the output terminal and configured to output an amplified first input signal, and a second terminal; and
a second transistor comprising a control terminal configured to receive a second input signal, a first terminal coupled to the output terminal and configured to output an amplified second input signal, and a second terminal;
a first switch comprising a first terminal coupled to the second terminal of the first transistor, and a second terminal;
a second switch comprising a first terminal coupled to the second terminal of the second transistor, and a second terminal;
a third switch comprising a first terminal coupled to the second terminal of the first transistor, and a second terminal coupled to a reference voltage terminal; and
a fourth switch comprising a first terminal coupled to the second terminal of the second transistor, and a second terminal coupled to the reference voltage terminal;
wherein the amplification signal is generated using at least the amplified first input signal and/or the amplified second input signal.

2. The amplifier circuit of claim 1, wherein the amplification unit further comprises:
a third transistor comprising a first terminal coupled to the output terminal, and a second terminal coupled to the first terminal of the first transistor; and
a fourth transistor comprising a first terminal coupled to the output terminal, and a second terminal coupled to the first terminal of the second transistor.

3. The amplifier circuit of claim 2, further comprising:
a fifth switch comprising a first terminal coupled to the first terminal of the first transistor, and a second terminal coupled to the reference voltage terminal; and
a sixth switch comprising a first terminal coupled to the first terminal of the second transistor, and a second terminal coupled to the reference voltage terminal.

4. The amplifier circuit of claim 3, wherein:
the third transistor further comprises a control terminal, and the fourth transistor further comprises a control terminal;
the amplifier circuit further comprises:
a seventh switch comprising a first terminal coupled to the control terminal of the third transistor, and a second terminal;
an eighth switch comprising a first terminal coupled to the control terminal of the fourth transistor, and a second terminal; and
a capacitor comprising a first terminal coupled to the second terminal of the seventh switch and the second terminal of the eighth switch, and a second terminal coupled to the reference voltage terminal.

5. The amplifier circuit of claim 1, further comprising:
a fifth switch comprising a first terminal coupled to the output terminal, and a second terminal coupled to the first terminal of the first transistor.

6. The amplifier circuit of claim 5, further comprising:
a sixth switch comprising a first terminal coupled to the output terminal, and a second terminal coupled to the first terminal of the second transistor.

7. The amplifier circuit of claim 6, further comprising:
a seventh switch comprising a first terminal coupled to the first terminal of the first transistor, and a second terminal coupled to a reference voltage terminal; and
a eighth switch comprising a first terminal coupled to the first terminal of the second transistor, and a second terminal coupled to the reference voltage terminal.

8. An amplifier circuit comprising:
an output terminal configured to output an amplification signal;
an amplification unit comprising:
a first transistor comprising a control terminal configured to receive a first input signal, a first terminal coupled to the output terminal and configured to output an amplified first input signal, and a second terminal; and
a second transistor comprising a control terminal configured to receive a second input signal, a first terminal coupled to the output terminal and configured to output an amplified second input signal, and a second terminal;
a first switch comprising a first terminal coupled to the second terminal of the first transistor, and a second terminal; and
a second switch comprising a first terminal coupled to the output terminal, and a second terminal coupled to the first terminal of the first transistor or the first terminal of the second transistor;
wherein the amplification signal is generated using at least the amplified first input signal and/or the amplified second input signal.

9. The amplifier circuit of claim 8, further comprising:
a third switch comprising a first terminal coupled to the first terminal of the first transistor, and a second terminal coupled to a reference voltage terminal.

10. The amplifier circuit of claim 8, further comprising:
a third switch comprising a first terminal coupled to the first terminal of the second transistor, and a second terminal coupled to a reference voltage terminal.

11. The amplifier circuit of claim 1, wherein the amplification unit further comprises:
a fifth transistor comprising a first terminal coupled to the output terminal, and a second terminal coupled to the first terminal of the first transistor and the first terminal of the second transistor.

12. The amplifier circuit of claim 1, wherein a frequency band of the first input signal is different from a frequency band of the second input signal.

13. An amplifier circuit comprising:
an output terminal configured to output an amplification signal;
an amplification unit comprising:
a first transistor comprising a control terminal configured to receive a first input signal, a first terminal coupled to the output terminal and configured to output an amplified first input signal, and a second terminal;
a second transistor comprising a control terminal configured to receive a second input signal, a first terminal coupled to the output terminal and configured to output an amplified second input signal, and a second terminal; and a third transistor coupled between the output terminal and the first transistor, and coupled between the output terminal and the second transistor, the third transistor comprising a first terminal coupled to the output terminal, and a second terminal;

a first switch comprising a first terminal coupled to the second terminal of the third transistor, and a second terminal coupled to the first terminal of the first transistor;

a second switch comprising a first terminal coupled to the second terminal of the third transistor, and a second terminal coupled to the first terminal of the second transistor; and a third switch comprising a first terminal coupled to the first terminal of the first transistor, and a second terminal coupled to a reference voltage terminal;

wherein the amplification signal is generated using at least the amplified first input signal and/or the amplified second input signal.

14. The amplifier circuit of claim 13, further comprising:

a fourth switch comprising a first terminal coupled to the first terminal of the second transistor, and a second terminal coupled to the reference voltage terminal.

* * * * *